(12) United States Patent
Sakuratani et al.

(10) Patent No.: US 8,797,708 B2
(45) Date of Patent: Aug. 5, 2014

(54) MONOLITHIC CERAMIC ELECTRONIC COMPONENT INCLUDING OUTER-LAYER DUMMY ELECTRODE GROUPS

(75) Inventors: Masahiro Sakuratani, Nagaokakyo (JP); Shigekatsu Yamamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 75 days.

(21) Appl. No.: 13/517,625

(22) Filed: Jun. 14, 2012

(65) Prior Publication Data

US 2012/0319537 A1  Dec. 20, 2012

(30) Foreign Application Priority Data

Jun. 16, 2011  (JP) ................................. 2011-133885
Mar. 30, 2012  (JP) ................................. 2012-079713

(51) Int. Cl.
*H01G 4/005* (2006.01)
*H01G 4/06* (2006.01)
*H01L 41/047* (2006.01)
*H01L 41/273* (2013.01)
*H01L 41/29* (2013.01)

(52) U.S. Cl.
CPC ............. *H01L 41/0471* (2013.01); *H01L 41/29* (2013.01); *H01L 41/273* (2013.01)
USPC ....................................... 361/303; 361/321.2

(58) Field of Classification Search
USPC .................................... 361/303, 306.3, 321.2
See application file for complete search history.

(56) References Cited

U.S. PATENT DOCUMENTS

| | | | |
|---|---|---|---|
| 5,040,092 A * | 8/1991 | Katho et al. | ................ 361/321.2 |
| 6,960,366 B2 | 11/2005 | Ritter et al. | |
| 6,972,942 B2 | 12/2005 | Ritter et al. | |
| 6,982,863 B2 | 1/2006 | Galvagni et al. | |
| 7,067,172 B2 | 6/2006 | Ritter et al. | |
| 7,092,236 B2 * | 8/2006 | Lee et al. | ....................... 361/311 |

(Continued)

FOREIGN PATENT DOCUMENTS

| | | |
|---|---|---|
| JP | 2004-327983 A | 11/2004 |
| JP | 2005-340371 A | 12/2005 |
| JP | 2007-042743 A | 2/2007 |
| JP | 2011-192968 A | 9/2011 |

OTHER PUBLICATIONS

Taniguchi et al., "Multilayer Ceramic Electronic Component and Manufacturing Method Thereof", U.S. Appl. No. 12/485,360, filed Jun. 16, 2009.

(Continued)

*Primary Examiner* — David M Sinclair
(74) *Attorney, Agent, or Firm* — Keating & Bennett, LLP

(57) ABSTRACT

Two or more outer-layer dummy conductors are successively arranged at predetermined intervals in the height direction, thereby forming a plurality of outer-layer dummy groups. Given that an interval between the adjacent outer-layer dummy conductors within each of the outer-layer dummy groups is d and an interval between the adjacent outer-layer dummy groups is g, g is greater than d. On that condition, the outer-layer dummy groups can be positioned satisfactorily apart away from each other, while plating deposition points are ensured. As a result, pressing of inner electrodes through the outer-layer dummy conductors can be relieved, whereby the distance between the inner electrodes can be prevented from being locally shortened and a reduction of BDV can be prevented.

4 Claims, 12 Drawing Sheets

(56) References Cited

U.S. PATENT DOCUMENTS

| | | | |
|---|---|---|---|
| 7,152,291 B2 | 12/2006 | Ritter et al. | |
| 7,154,374 B2 | 12/2006 | Ritter et al. | |
| 7,161,794 B2 | 1/2007 | Galvagni et al. | |
| 7,177,137 B2 | 2/2007 | Ritter et al. | |
| 7,319,582 B2 * | 1/2008 | Takashima et al. | 361/303 |
| 7,344,981 B2 | 3/2008 | Ritter et al. | |
| 7,345,868 B2 | 3/2008 | Trinh | |
| 7,394,647 B2 * | 7/2008 | Togashi | 361/321.1 |
| 7,463,474 B2 | 12/2008 | Ritter et al. | |
| 8,120,891 B2 * | 2/2012 | Takashima et al. | 361/321.2 |
| 2004/0257748 A1 | 12/2004 | Ritter et al. | |
| 2005/0046536 A1 | 3/2005 | Ritter et al. | |
| 2006/0250747 A1 | 11/2006 | Takashima et al. | |
| 2007/0014075 A1 | 1/2007 | Ritter et al. | |
| 2007/0025054 A1 | 2/2007 | Tonogai et al. | |
| 2008/0123248 A1 | 5/2008 | Kunishi et al. | |
| 2008/0123249 A1 | 5/2008 | Kunishi et al. | |
| 2008/0158774 A1 | 7/2008 | Trinh | |
| 2011/0205684 A1 | 8/2011 | Yamamoto et al. | |

OTHER PUBLICATIONS

Yoshida et al., "Monolithic Ceramic Electronic Component", U.S. Appl. No. 12/494,537, filed Jun. 30, 2009.

Iwanaga et al., "Laminated Ceramic Electronic Component and Manufacturing Method Therefor", U.S. Appl. 13/189,636, filed Jul. 25, 2011.

Sasaki, "Electronic Component", U.S. Appl. No. 13/187,678, filed Jul. 21, 2011.

Akazawa et al., "Multilayer Ceramic Electronic Component", U.S. Appl. No. 13/357,677, filed Jan. 25, 2012.

Taniguchi et al., "Multilayer Ceramic Electronic Component and Manufacturing Method Thereof", U.S. Appl. No. 13/484,300, filed May 31, 2012.

Akazawa et al., "Laminated Ceramic Electronic Component", U.S. Appl. No. 13/494,042, filed Jun. 12, 2012.

Sakuratani, "Monolithic Ceramic Electronic Component", U.S. Appl. No. 13/517,624, filed Jun. 14, 2012.

* cited by examiner

MONOLITHIC CERAMIC ELECTRONIC COMPONENT INCLUDING OUTER-LAYER DUMMY ELECTRODE GROUPS

BACKGROUND OF THE INVENTION

1. Field of the Invention

The present invention relates to a monolithic ceramic electronic component, and more particularly to a monolithic ceramic electronic component provided with outer electrodes including plated films that are directly disposed on outer surfaces of a ceramic base element.

2. Description of the Related Art

Recently, sizes of electronic devices, such as cellular phones, notebook personal computers, digital cameras, and digital audio devices, have become increasingly smaller. Monolithic ceramic electronic components capable of being manufactured to have smaller sizes but with higher performance have been used in many of such electronic devices.

The monolithic ceramic electronic component usually includes a ceramic base element including a plurality of stacked ceramic layers, inner electrodes formed inside the ceramic base element, and outer electrodes formed on outer surfaces of the ceramic base element. Further, the monolithic ceramic electronic component is placed on conductive lands of a mounting board and is mounted to the board by using a conductive bonding material, e.g., a solder.

There are still now continuing demands for further size reduction of monolithic ceramic electronic components.

However, when the size of the monolithic ceramic electronic component is reduced, an effective area where the inner electrodes are opposed to each other is also reduced. Hence characteristics of the monolithic ceramic electronic component generally tend to degrade.

Further, in a multi-terminal monolithic ceramic electronic component, it is necessary to form a plurality of stripe-shaped outer electrodes at a narrow pitch. However, a known method of baking a thick film paste has a limit in accuracy of applying the paste and has a difficulty in forming the outer electrodes with high accuracy.

In view of such a situation, a method of forming the outer electrodes directly by plating is proposed. With that method, thin and flat outer electrodes can be formed, and hence the effective area of the inner electrodes can be increased. Moreover, because plated metals are deposited on the exposed portions of the inner electrodes, the outer electrodes can be formed with high accuracy even at a narrow pitch.

To realize more reliable growth of the plated metals when the outer electrodes are formed directly by plating, Japanese Unexamined Patent Application Publication No. 2004-327983, for example, proposes the use of dummy conductors (anchor tabs). According to the technique disclosed in Japanese Unexamined Patent Application Publication No. 2004-327983, plated metals can be deposited on not only the exposed portions of the inner electrodes, but also on the exposed portions of the dummy conductors. Therefore, growth of the plated metals can be more reliably ensured.

With the method disclosed in Japanese Unexamined Patent Application Publication No. 2004-327983, however, reliability, e.g., breakdown voltage or BDV, of the monolithic ceramic electronic component may degrade in some cases. The inventors of the invention described and claimed in the present application have conducted intensive studies to determine the cause of the degradation of reliability. As a result, the inventors have discovered that the degradation of reliability (BDV) is attributable to the presence of the dummy conductors. In more detail, the inventors have discovered that, when the dummy conductors are present in an outer layer portion where there are no inner electrodes, the inner electrodes positioned in overlapped relation to the dummy conductors are excessively pressed in a pressing step before firing due to the presence of the dummy conductors, and the distance between the inner electrodes adjacent to each other is locally shortened.

SUMMARY OF THE INVENTION

Accordingly, preferred embodiments of the present invention provide a monolithic ceramic electronic component including a ceramic base element including a plurality of stacked ceramic layers and, as outer surfaces, first and second principal surfaces opposed to each other, first and second lateral surfaces opposed to each other, and first and second end surfaces opposed to each other, first inner electrodes disposed inside the ceramic base element and each including a first opposing portion and a first lead-out portion led out from the first opposing portion to the outer surface of the ceramic base element, second inner electrodes disposed inside the ceramic base element and each including a second opposing portion, which is opposed to the first opposing portion with the ceramic layer interposed therebetween, and a second lead-out portion led out from the second opposing portion to the outer surface of the ceramic base element, a first outer electrode disposed on the outer surface of the ceramic base element and including a plated film that directly covers an exposed portion of the first lead-out portion, and a second outer electrode disposed on the outer surface of the ceramic base element, electrically connected to the exposed portion of the second lead-out portion, and connected to a different potential from that of the first outer electrode.

Given that an extension direction of an interconnection between the first and second principal surfaces is defined as a height direction, that a region where the first inner electrodes and the second inner electrodes are present in the height direction is defined as an inner layer portion, and that a region where the first inner electrodes and the second inner electrodes are both not present in the height direction is defined as an outer layer portion, outer-layer dummy conductors are disposed in the outer layer portion such that the outer-layer dummy conductors are each led out to the outer surface of the ceramic base element in overlapped relation to the first lead-out portion when the ceramic base element is viewed through projection in the height direction, the outer-layer dummy conductors including exposed portions directly covered with the plated film of the first outer electrode.

Another monolithic ceramic electronic component according to a further preferred embodiment of the present invention includes two or more outer-layer dummy conductors successively arranged at predetermined intervals in the height direction, thereby defining a plurality of outer-layer dummy groups, and given that an interval between the adjacent outer-layer dummy conductors within each of the outer-layer dummy groups is d and an interval between the adjacent outer-layer dummy groups is g, g is greater than d.

Preferably, g≤about 6 μm, for example, is further satisfied.

In a monolithic ceramic electronic component according to another preferred embodiment of the present invention, given that an extending direction of an interconnection between the first and second lateral surfaces is defined as a widthwise direction, and that an extending direction of an interconnection between the first and second end surfaces is defined as a lengthwise direction, a size of each of the first and second lateral surfaces along the lengthwise direction is longer than a size of each of the first and second end surfaces along the widthwise direction, the first opposing portion is substantially in a rectangular shape including a longer side and a shorter side, and the first lead-out portion is led out from the longer side of the first opposing portion to at least one of the first and second lateral surfaces.

In the preferred embodiment described above, the first lead-out portion is more preferably led out to be positioned across a center of at least one of the first and second lateral surfaces in the lengthwise direction.

With the above-described preferred embodiment of the present invention, two or more outer-layer dummy conductors preferably are successively arranged at the predetermined intervals, whereby plating deposition points are ensured. In addition, the interval between the adjacent outer-layer dummy groups is maintained relatively large to such an extent that pressing of the inner electrodes through the outer-layer dummy conductors is relieved. As a result, the distance between the inner electrodes can be prevented from being locally shortened. It is hence possible to reduce and prevent degradation of reliability of the monolithic ceramic electronic component, e.g., a reduction of BDV, which may be caused by the local shortening of the distance between the inner electrodes.

In relation to a preferred embodiment of the present invention, from the viewpoint of reducing and preventing the degradation of reliability, it can be said that the above-mentioned interval g between the adjacent outer-layer dummy groups is preferably longer. However, the longer the interval g, the stronger a tendency to impede growth of the plated film for the first outer electrode. Stated another way, the plated film for the first outer electrode becomes hard to be continuously formed. For that reason, the interval g is preferably set so as to satisfy g≤about 6 μm, for example. By satisfying that condition, the growth of the plated film for the first outer electrode can be more reliably ensured.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
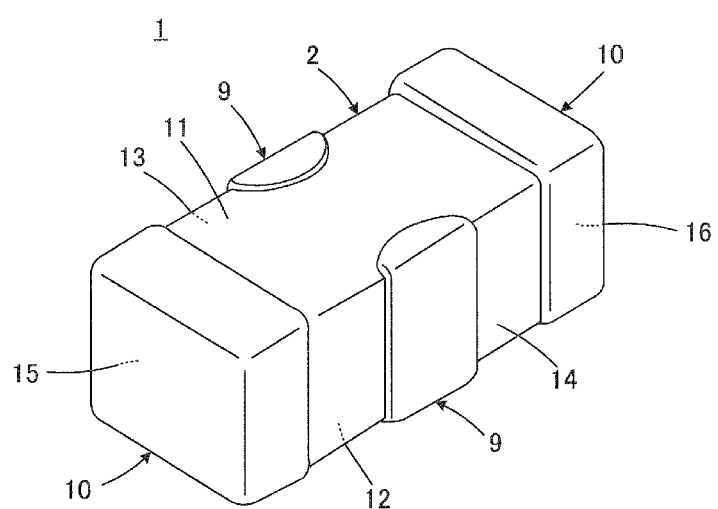
FIG. 1 is a perspective view illustrating an external appearance of a monolithic ceramic capacitor as a monolithic ceramic electronic component according to a first preferred embodiment of the present invention.

Preferred embodiments of the present invention will be described below in connection with a monolithic ceramic capacitor as one example of a monolithic ceramic electronic component.

First Preferred Embodiment

A first preferred embodiment of the present invention will be described below with reference to FIGS. 1 to 7. A monolithic ceramic capacitor 1 according to the first preferred embodiment preferably is of the three-terminal type, for example. The monolithic ceramic capacitor 1 includes a ceramic base element 2. The monolithic ceramic capacitor 1 further includes first and second inner electrodes 3 and 4, first and second inner-layer dummy conductors 5 and 6, and outer-layer dummy conductors 7, which are all disposed inside the ceramic base element 2, as well as first and second outer electrodes 9 and 10, which are disposed on outer surfaces of the ceramic base element 2. Details of the structure of the monolithic ceramic capacitor 1 will be described below in order of (1) Ceramic Base Element, (2) Inner Electrode, (3) Inner-Layer Dummy Conductor, (4) Outer-Layer Dummy Conductor, and (5) Outer Electrode. Description of (6) manufacturing method follows thereafter.

(1) Ceramic Base Element

The ceramic base element 2 preferably is substantially parallelepiped, and it includes, as the outer surfaces, a pair of first and second principal surfaces 11 and 12 opposed to each other, a pair of lateral surfaces 13 and 14 opposed to each other, and a pair of end surfaces 15 and 16 opposed to each other.

Herein, an extending direction of an interconnection between the principal surfaces 11 and 12 is defined as a height direction, a direction of an interconnection between the lateral surfaces 13 and 14 is defined as a widthwise direction, and an extending direction of an interconnection between the end surfaces 15 and 16 is defined as a lengthwise direction. In this preferred embodiment, a size of the ceramic base element 2 in the lengthwise direction is longer than that in the widthwise direction, and the size in the lengthwise direction is about twice that in the widthwise direction, for example.

The ceramic base element 2 is preferably rounded at corners and ridges thereof.

Figure 2:
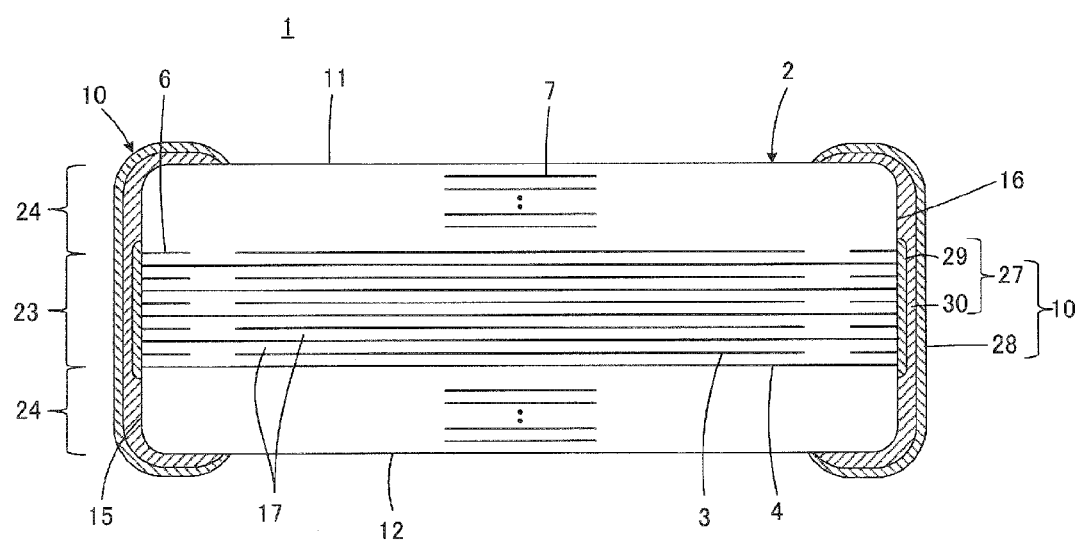
FIG. 2 is a sectional view taken along a plane parallel to lateral surfaces of a ceramic base element in the monolithic ceramic capacitor illustrated in FIG. 1.
Figure 3:
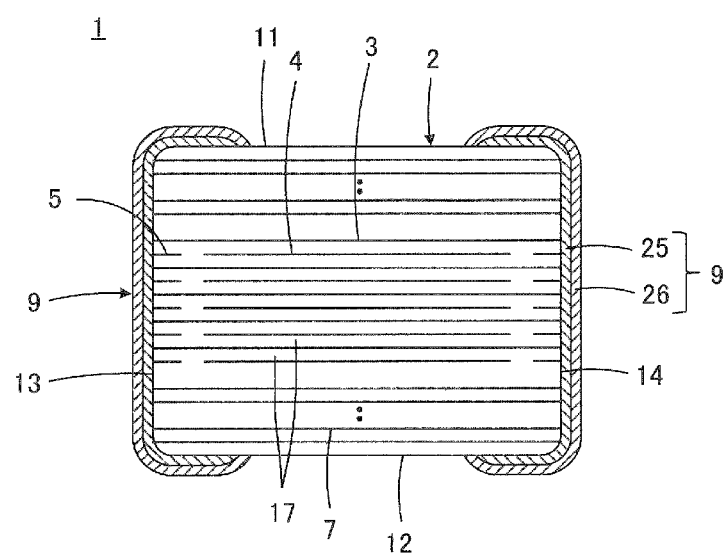
FIG. 3 is a sectional view taken along a plane parallel to end surfaces of the ceramic base element in the monolithic ceramic capacitor illustrated in FIG. 1.

As illustrated in FIGS. 2 and 3, the ceramic base element 2 has a multilayer structure including a plurality of ceramic layers 17, which extend in a direction parallel or substantially parallel to the principal surfaces 11 and 12 and which are stacked in the height direction. A thickness of each of the ceramic layers 17 is preferably about 0.5 μm to about 10 μm and in particular preferably about 0.7 μm to about 3.0 μm, for example. A ceramic material constituting the ceramic layer 17 can be, for example, a dielectric ceramic containing $BaTiO_3$, $CaTiO_3$, $SrTiO_3$, $CaZrO_3$, or the like as a main component. The dielectric ceramic may further contain, in addition to the main component, auxiliary components, e.g., a Mn compound, a Mg compound, a Si compound, a Co compound, a Ni compound, and a rare-earth element compound.

(2) Inner Electrode

Figure 4:
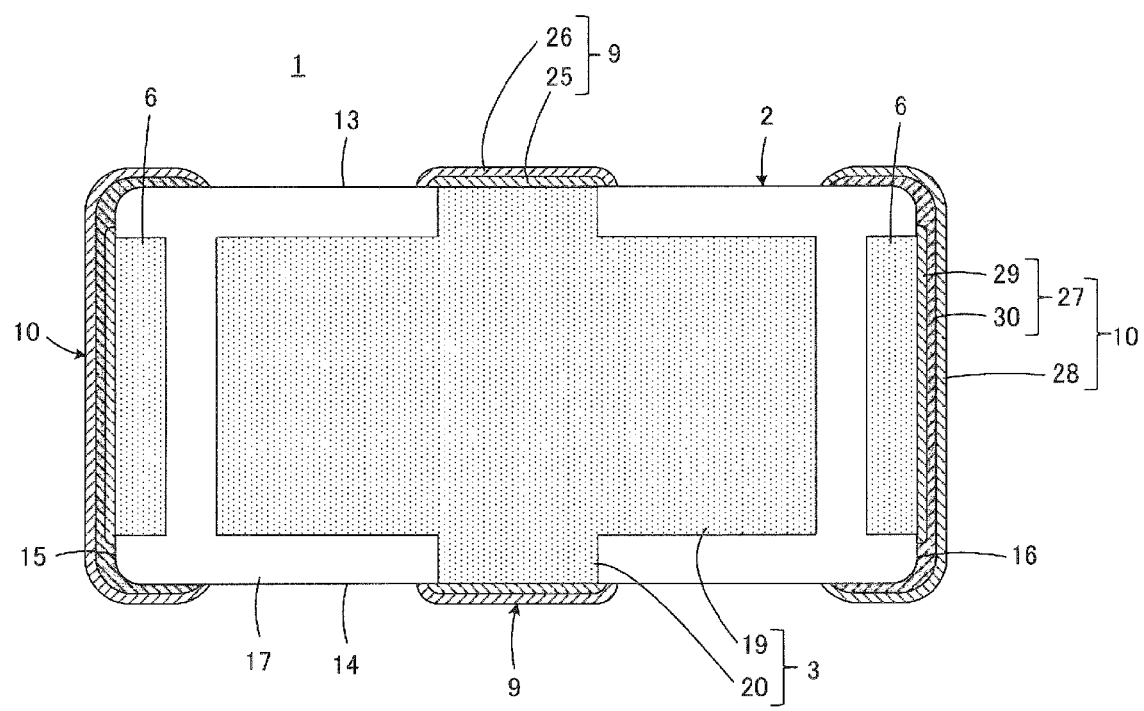
FIG. 4 is a sectional view taken along a plane parallel to principal surfaces of the ceramic base element in the monolithic ceramic capacitor illustrated in FIG. 1, the plane including a first inner electrode that extends therein.
Figure 5:
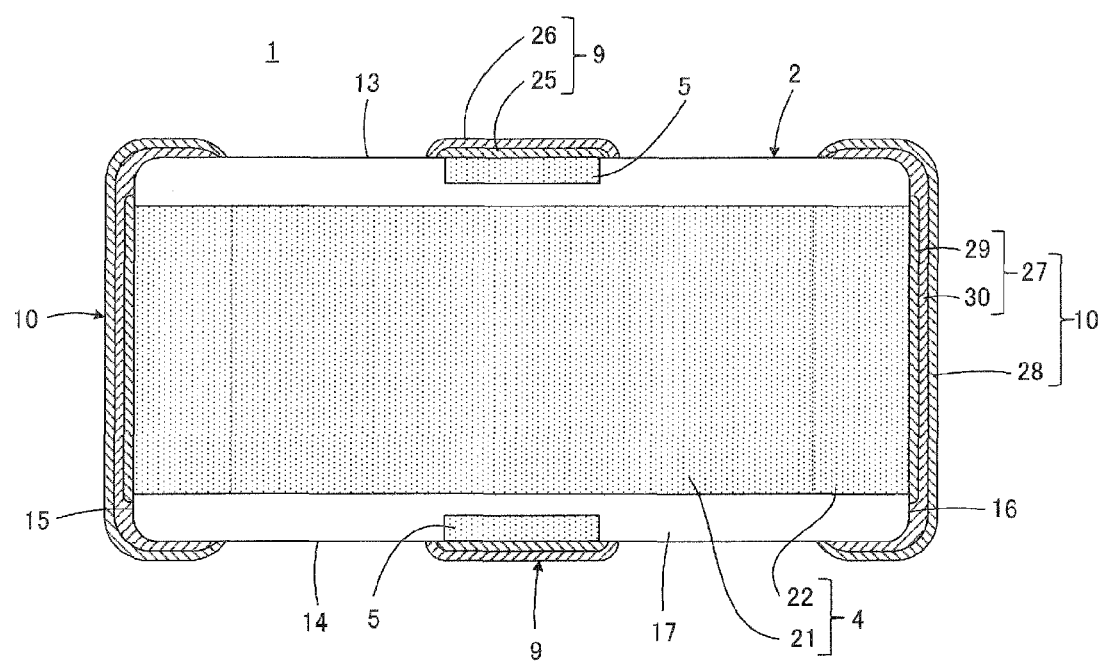
FIG. 5 is a sectional view taken along a plane parallel to the principal surfaces of the ceramic base element in the monolithic ceramic capacitor illustrated in FIG. 1, the plane including a second inner electrode that extends therein.

The inner electrode includes a plurality of first inner electrodes 3 each illustrated in FIG. 4, and a plurality of second inner electrodes 4 each illustrated in FIG. 5. The plurality of first inner electrodes 3 and the plurality of second inner electrodes 4 are alternately arranged in the height direction (stacking direction) of the ceramic base element 2, as illustrated in FIGS. 2 and 3.

(2)-1. First Inner Electrode

As illustrated in FIG. 4, the first inner electrode 3 includes a first opposing portion 19 opposed to the second inner electrode 4 that is positioned adjacent to the relevant first inner electrode 3, and two first lead-out portions 20 each led out from the first opposing portion 19 to the outer surface of the ceramic base element 2. In this preferred embodiment, the first inner electrode 3 preferably has a substantially crisscross shape. One and the other of the two first lead-out portions 20 are led out respectively to the first and second lateral surfaces 13 and 14. In other words, the first inner electrode 3 is disposed so as to extend from the first lateral surface 13 to the second lateral surface 14. Further, a size of the first opposing portion 19 in the lengthwise direction is longer than that in the widthwise direction.

(2)-2. Second Inner Electrode

As illustrated in FIG. 5, the second inner electrode 4 includes a second opposing portion 21 opposed to the first inner electrode 3 that is positioned adjacent to the relevant second inner electrode 4, and two second lead-out portions 22 each led out from the second opposing portion 21 to the outer surface of the ceramic base element 2. In FIG. 5, a boundary between the second opposing portion 21 and the second lead-out portion 22 in the second inner electrode 4 is denoted by a dotted line. In this preferred embodiment, the second inner electrode 4 preferably has a substantially rectangular shape. Further, one and the other of the two second lead-out portions 22 of the second inner electrode 4 are led out respectively to the first and second end surfaces 15 and 16. In other words, the second inner electrode 4 is disposed so as to extend from the first end surface 15 to the second end surface 16.

(2)-3. Others

For example, Ni, Cu, Ag, Pd, an Ag—Pd alloy, Au, etc. can be optionally used as conductive materials constituting the inner electrodes 3 and 4.

A thickness of each of the inner electrodes 3 and 4 is preferably about 0.3 μm to about 2.0 μm, for example.

An electrostatic capacity is generated in a region where the first opposing portion 19 of the first inner electrode 3 and the second opposing portion 21 of the second inner electrode 4 are opposed to each other with the ceramic layer 17 interposed therebetween. A region where the first and second inner electrode 3 and 4 are present along the height direction, the region including the above-mentioned region generating the electrostatic capacity, is defined as an inner layer portion 23.

On the other hand, a region where the first and second inner electrode 3 and 4 are both not present along the height direction is defined as an outer layer portion 24. There are two outer layer portions 24 on both sides of the inner layer portion 23, i.e., on one side closer to the first principal surface 11 and on the other side closer to the second principal surface 12.

(3) Inner-Layer Dummy Conductor

The inner-layer dummy conductor is disposed in the inner layer portion 23, and it includes a plurality of first inner-layer dummy conductors 5 each illustrated in FIG. 5 and a plurality of second inner-layer dummy conductors 6 each illustrated in FIG. 4.

(3)-1. First Inner-Layer Dummy Conductor

In this preferred embodiment, as illustrated in FIG. 5, the first inner-layer dummy conductor 5 preferably is flush with the second inner electrode 4. The first inner-layer dummy conductor 5 is connected to the first outer electrode 9.

(3)-2. Second Inner-Layer Dummy Conductor

In this preferred embodiment, as illustrated in FIG. 4, the second inner-layer dummy conductor 6 preferably is flush with the first inner electrode 3. The second inner-layer dummy conductor 6 is connected to the second outer electrode 10.

(3)-3. Others

The inner-layer dummy conductors 5 and 6 function as deposition points for plated films that constitute respective underlying layers of the first and second outer electrodes 9 and 10, thereby increasing current-carrying efficiency. Further, the inner-layer dummy conductors 5 and 6 contribute to increasing the strength of the ceramic base element 2.

Preferable conditions for materials and thicknesses of the inner-layer dummy conductors 5 and 6 are similar to those for the inner electrodes 3 and 4. The inner-layer dummy conductors 5 and 6 are preferably made of the same material in the same thickness as in the inner electrodes 3 and 4.

It is to be noted that the inner-layer dummy conductors 5 and 6 may be not formed in some cases.

(4) Outer-Layer Dummy Conductor

As illustrated in FIGS. 2 and 3, the outer-layer dummy conductor 7 is disposed in the outer layer portion 24.

Figure 6:
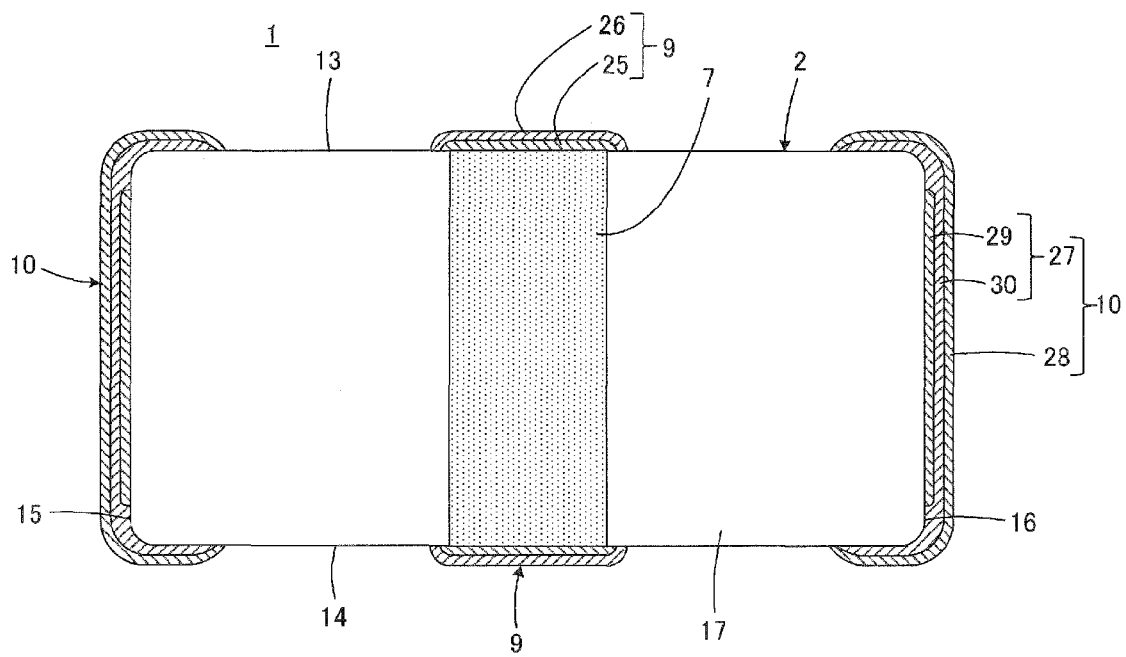
FIG. 6 is a sectional view taken along a plane parallel to the principal surfaces of the ceramic base element in the monolithic ceramic capacitor illustrated in FIG. 1, the plane including an outer-layer dummy conductor that extends therein.

The outer-layer dummy conductor 7 is preferably led out to at least two positions in the outer surfaces of the ceramic base element 2. In this preferred embodiment, as illustrated in FIG. 6, the outer-layer dummy conductor 7 preferably has a substantially rectangular shape and is led out to two positions in the outer surfaces of the ceramic base element 2, i.e., to the first lateral surface 13 and the second lateral surface 14. In other words, the outer-layer dummy conductor 7 is disposed so as to extend from the first lateral surface 13 to the second lateral surface 14.

The outer-layer dummy conductor 7 functions as a deposition point for a plated film that constitutes an underlying layer of the first outer electrode 9. Because of the outer-layer dummy conductor 7 being led out to two positions as described above, when media such as steel balls come into contact with one of the exposed portions of the outer-layer dummy conductor 7 during plating, an electric current is supplied to the other exposed portion of the outer-layer dummy conductor 7 as well. Thus, when the outer-layer dummy conductor 7 includes two or more exposed portions, a probability of contact between the exposed portions of the outer-layer dummy conductor 7 and the media is increased and the current-carrying efficiency is increased. As a result, a plating time necessary to form the plated films, which serve as the underlying layers of the first outer electrodes 9 described later, is shortened.

As illustrated in FIGS. 2 and 3, the outer-layer dummy conductor 7 is successively stacked in plural number in the stacking direction of the ceramic layers 17. The outer-layer dummy conductor 7 is preferably disposed in number of 10 to 100 in each of the outer layer portions 24.

The outer-layer dummy conductors 7 are each arranged in overlapped relation to the first lead-out portion 20 when the ceramic base element 2 is viewed through projection in the height direction. With such an arrangement, the exposed portions of the outer-layer dummy conductors 7 define an exposed portion group in the form of a row, together with the exposed portions of the first lead-out portions 20, in the outer surface of the ceramic base element 2. In this preferred embodiment, the exposed portion group is preferably provided in each of the first and second lateral surfaces 13 and 14.

Figure 7:
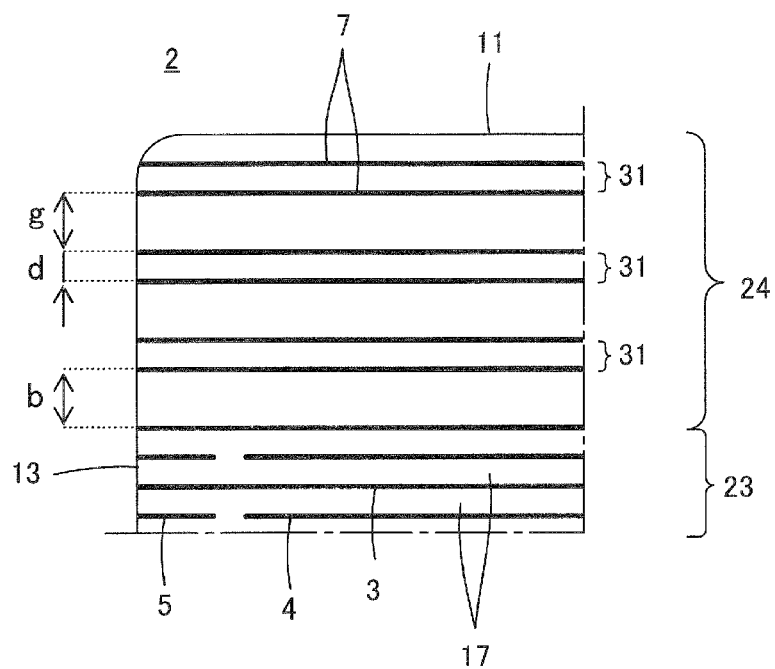
FIG. 7 is an enlarged view of a portion of the ceramic base element, illustrated in FIG. 3, to explain features of a preferred embodiment of the present invention.

As illustrated in FIG. 7, in the outer layer portion 24, the outer-layer dummy conductors 7 constitute a plurality of outer-layer dummy groups 31, each group including plural outer-layer dummy conductors 7 that are arranged at a predetermined interval. Here, given that an interval between the adjacent outer-layer dummy conductors 7 within each of the outer-layer dummy groups 31 is d and an interval between the adjacent outer-layer dummy groups 31 is g, g is set to be greater than d.

When the above-described condition is satisfied, the outer-layer dummy conductors 7 are successively arranged at the predetermined intervals, whereby plating deposition points are ensured. In addition, the interval g between the adjacent outer-layer dummy groups 31 is held relatively large to such an extent that pressing of the inner electrodes 3 and 4 through the outer-layer dummy conductors 7 is relieved. As a result, degradation of reliability can be effectively prevented.

As seen from EXPERIMENTAL EXAMPLES described later, if g is not greater than 2 t, there is a risk that the reliability may degrade.

In particular, the above-mentioned advantageous effect appears more significantly when the outer-layer dummy conductors 7 are led out in the widthwise direction in a state where the first inner electrodes 3, each of which includes the first opposing portion 19 having the size in the lengthwise direction longer than the size in the widthwise direction, are disposed, as in this preferred embodiment.

The degradation of reliability is attributable to the fact that, during a pressing step before firing, the outer-layer dummy conductors 7 act to press the first lead-out portion 20, thus causing the pressed first lead-out portion 20 to drag in the first opposing portion 19, whereby the distance between the inner electrodes 3 and 4 is shortened in a region in which a root portion of the first lead-out portion 20 has sunk. Such sinking of the root portion of the first lead-out portion 20 is apt to more easily occur when the first lead-out portion 20 is led out from the longer side of the first opposing portion 19.

Moreover, the sinking of the root portion of the first lead-out portion 20 is apt to easily occur in particular when the outer-layer dummy conductors 7 are led out to a central portion of each of the first and second lateral surfaces 13 and 14 in the lengthwise direction.

From the viewpoint of suppressing the degradation of reliability, it can be said that the above-mentioned interval g is preferably longer. However, the longer the interval g, the stronger is a tendency to impede growth of the plated film that serves as the underlying layer of the first outer electrode 9. Stated another way, there increases a risk that plated films growing with the exposed portions of the adjacent outer-layer dummy conductors 7 being nuclei may become hard to continuously join with each other in the height direction. For that reason, g≤about 6 μm, for example, is preferably satisfied.

From a similar point of view, given that a distance in the height direction between one of the outer-layer dummy conductors 7 in the outer layer portion 24, which one is positioned closest to the inner layer portion 23, and the first or second inner electrode 3 or 4 (the second inner electrode 4 in FIG. 7) in the inner layer portion 23, which is positioned closest to the outer layer portion 24, is b, the distance b is preferably equal to the interval g between the adjacent outer-layer dummy groups 31. Thus, the distance b is more preferably about 6 μm or less, for example.

While one outer-layer dummy group 31 preferably includes two outer-layer dummy conductors 7 in FIG. 7, the group 31 may also include three or more outer-layer dummy conductors 7. Further, it is to be noted that the above-described layout of the outer-layer dummy conductors 7, illustrated in FIG. 7, does not appear in FIGS. 2 and 3 because the layout of the outer-layer dummy conductors 7 is illustrated in the simplified form in FIGS. 2 and 3.

The outer-layer dummy conductor 7 is preferably made of the same material as that of the inner electrodes 3 and 4. For example, Ni, Cu, Ag, Pd, an Ag—Pd alloy, Au, etc., mentioned above, can also be optionally used as a conductive material of the outer-layer dummy conductor 7.

A thickness of the outer-layer dummy conductor 7 is preferably about 0.3 μm to about 2.0 μm, for example.

(5) Outer Electrode (5)-1. First Outer Electrode

As specifically illustrated in FIG. 3, the first outer electrode 9 is disposed on each of the first and second lateral surfaces 13 and 14 of the ceramic base element 2. In this preferred embodiment, the first outer electrode 9 is disposed to extend up to over respective portions of the first and second principal surfaces 11 and 12.

The first outer electrode 9 is electrically connected to the first inner electrodes 3. As illustrated in FIGS. 3 to 6, the first outer electrode 9 includes an underlying layer 25 and an overlying layer 26, the overlying layer 26 being disposed on the underlying layer 25 as required.

The underlying layer 25 of the first outer electrode 9 preferably is a plated film. The plated film constituting the underlying layer 25 of the first outer electrode 9 directly covers not only the exposed portions of the first lead-out portions 20 of the first inner electrodes 3 and the exposed portions of the first inner-layer dummy conductors 5, but also the exposed portions of the outer-layer dummy conductors 7. For example, Cu, Ni, Ag, Pd, an Ag—Pd alloy, Au, Sn, Pb, Bi, Zn, etc. can be optionally used as a metal constituting the plated film that serves as the underlying layer 25. The plated film preferably does not contain glass ingredients. Further, a metal proportion of the plated film per unit volume is preferably about 99% by volume or more. A thickness of the plated film is preferably about 1 μm to about 15 μm, for example, in its thickest portion. The first inner-layer dummy conductor 5 and the outer-layer dummy conductor 7 act to promote deposition and growth of the plated film that serves as the underlying layer 25.

When the overlying layer 26 is provided in the first outer electrode 9, the overlying layer 26 is constituted as, e.g., a plated film. For example, Cu, Ni, Ag, Pd, an Ag—Pd alloy, Au, Sn, Pb, Bi, Zn, etc. can be optionally used as a metal constituting the plated film that serves as the overlying layer 26. The plated film for the overlying layer 26 may include plural layers. A thickness of the plated film for the overlying layer 26 is preferably about 1 μm to about 10 μm per layer, for example.

When the overlying layer 26 is provided in the first outer electrode 9, it is preferable that the underlying layer 25 is constituted as a Ni plated film and the overlying layer 26 is constituted as a Sn plated film. Alternatively, when the overlying layer 26 includes plural layers, the overlying layer 26 preferably has a two-layer structure including a Ni plated layer and a Sn plated layer disposed on the Ni plated layer.

(5)-2. Second Outer Electrode

The second outer electrode 10 is connected to a different potential from that of the first outer electrode 9 and is disposed on each of the first and second end surfaces 15 and 16 of the ceramic base element 2. In this preferred embodiment, the second outer electrode 10 is disposed to extend up to over respective portions of the first and second principal surfaces 11 and 12 and respective portions of the first and second lateral surfaces 13 and 14.

The second outer electrode 10 covers the exposed portions of the second lead-out portions 22 in such a state that the second outer electrode 10 is electrically connected to the second inner electrodes 4. As illustrated in FIGS. 2 and 4 to 6, the second outer electrode 10 includes an underlying layer 27, which is contacted with the exposed portions of the second lead-out portions 22 of the second inner electrodes 4, and an overlying layer 28, which is disposed on the underlying layer 27 as required. The underlying layer 27 can be constituted as, e.g., a plated film, a sintered metal film, and/or a conductive resin film.

When the plated film is selected as a film constituting the underlying layer 27, Cu, Ni, Ag, Pd, an Ag—Pd alloy, Au, Sn, Pb, Bi, Zn, etc. can be optionally used, for example, as a metal constituting the plated film. The plated film preferably does not contain glass ingredients. A thickness of the underlying layer 27 is preferably about 1 μm to about 20 μm in its thickest portion, for example. The second inner-layer dummy conductor 6 acts to promote deposition and growth of the plated film that serves as the underlying layer 27.

When the sintered metal film is selected as a film constituting the underlying layer 27, Cu, Ni, Ag, Pd, an Ag—Pd alloy, Au, etc. can be optionally used, for example, as a metal constituting the sintered metal film. The sintered metal film may contain glass ingredients. Further, the sintered metal film may be fired at the same time as the ceramic base element 2 and the inner electrodes 3 and 4. As an alternative, the sintered metal film may be formed by coating a conductive paste over the ceramic base element 2 after the firing, and then baking the conductive paste.

When the conductive resin film is selected as a film constituting the underlying layer 27, the conductive resin film can be formed by using a thermosetting resin alone or in a state mixed with a metal filler.

When the sintered metal film or the conductive resin film is selected, a thickness of the underlying layer 27 is preferably about 10 μm to about 50 μm, for example, in its thickest portion.

In the illustrated preferred embodiment, the underlying layer 27 includes a plated film 29, which is contacted with the respective exposed portions of the second inner electrodes 4 and the second inner-layer dummy conductors 6, and a sintered metal film 30 disposed on the plated film 29.

When the overlying layer 28 is to be further provided on the underlying layer 27 in the second outer electrode 10, the overlying layer 28 preferably is a plated film. For example, Cu, Ni, Ag, Pd, an Ag—Pd alloy, Au, Sn, Pb, Bi, Zn, etc. can be optionally used as a metal constituting the plated film that serves as the overlying layer 28. The plated film for the overlying layer 28 may include plural layers. In that case, the overlying layer 28 preferably has a two-layer structure including a Ni plated layer and a Sn plated layer disposed on the Ni plated layer. A thickness of the plated film for the overlying layer 28 is preferably about 1 μm to about 10 μm per layer, for example.

(6) Manufacturing Method

The monolithic ceramic capacitor 1 is manufactured, by way of example, as follows.

(6)-1.

A ceramic green sheet to be used as the ceramic layer 17, a conductive paste for the inner electrode, and a conductive paste for the outer electrode are prepared. The conductive paste for the inner electrode is also used as a conductive paste for the inner-layer dummy conductor and a conductive paste for the outer-layer dummy conductor. The ceramic green sheet and the conductive pastes for the inner electrode and the outer electrode contain a binder and a solvent. The binder and the solvent can be known organic ones, respectively.

(6)-2.

On ceramic green sheets, the conductive paste is printed in predetermined patterns by screen printing, for example, to form an inner electrode pattern, an inner-layer dummy conductor pattern, and an outer-layer dummy conductor pattern.

(6)-3.

An outer-layer ceramic green sheet on which neither the inner electrode pattern nor the outer-layer dummy conductor pattern are printed, the ceramic green sheet on which the outer-layer dummy conductor pattern is printed, and the ceramic green sheet on which the inner electrode and the inner-layer dummy conductor pattern are printed are stacked in predetermined order in respective predetermined numbers of sheets, whereby a mother laminate is fabricated.

Here, in the outer layer portion, the above-mentioned intervals d and g can be adjusted by adjusting the number of the stacked outer-layer ceramic green sheets on each of which the outer-layer dummy conductor pattern is not printed. Further, the above-mentioned distance b can also be adjusted when necessary. As an alternative, the intervals d and g and the distance b may be adjusted by adjusting the thickness of each of the outer-layer ceramic green sheets.

(6)-4.

The mother laminate is pressed in the stacking direction.

(6)-5.

The mother laminate is cut into a predetermined size, whereby a green ceramic base element is cut out.

(6)-6.

The green ceramic base element is fired. The ceramic base element 2 illustrated in the drawings is thereby obtained. A firing temperature is preferably about 900° C. to about 1300° C., for example, although this temperature depends on the materials of the ceramic sheet and the inner electrode.

Thereafter, barrel polishing is performed on the ceramic base element 2 when necessary. With the barrel polishing, corners and ridges of the ceramic base element 2 are rounded.

(6)-7.

The ceramic base element 2 after the barrel polishing is subjected to a plating process.

With the plating process, plated films constituting the underlying layers 25 of the first outer electrodes 9 are formed. At that time, as illustrated in FIG. 3, not only the first inner electrodes 3, but also the first inner-layer dummy conductors 5 and the outer-layer dummy conductors 7 are exposed to the lateral surfaces 13 and 14, and the plated films are deposited on those exposed portions that serve as starting points for the deposition. Therefore, the underlying layers 25 of the first outer electrodes 9 can be efficiently formed.

The plating process is preferably performed by electrolytic plating based on a rotating barrel method. Thus, a plating method is preferably performed as rotating barrel plating. Conductive media, such as steel balls, are used in the plating process.

Because of the outer-layer dummy conductor 7 including two exposed portions, when the conductive media come into contact with one of the exposed portions in the plating step, an electric current is supplied to the other exposed portion as well. Therefore, a probability of contact between the exposed portions of the outer-layer dummy conductor 7 and the conductive media is increased and the current-carrying efficiency is increased. As a result, a plating time required to form the underlying layers 25 is shortened.

In the above-described plating process, the plated films 29 for the underlying layers 27 of the second outer electrodes 10 can also be simultaneously formed while the respective exposed portions of the second inner electrodes 4 and the second inner-layer dummy conductors 6 serve as starting points for the deposition of the plated films.

After the plating process, heat treatment is preferably performed at temperature of about 600° C. to about 900° C., for example. The heat treatment increases the fixing strength of the plated films with respect to the ceramic base element 2.

(6)-8.

The sintered metal film 30 in the underlying layer 27 of each second outer electrode 10 is formed by coating a conductive paste and baking the conductive paste. A baking temperature is preferably about 700° C. to about 900° C., for example.

(6)-9.

The overlying layer 26 of the first outer electrode 9 and the overlying layer 28 of the second outer electrode 10 are formed by a plating process.

The monolithic ceramic capacitor 1 is thus completed.

Second Preferred Embodiment

Figure 8:
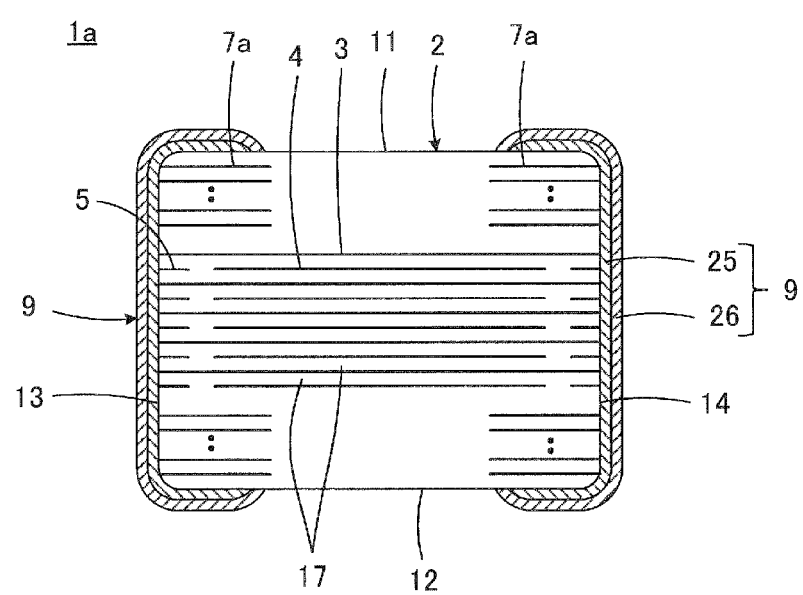
FIG. 8 is a sectional view taken along a plane parallel to end surfaces of a ceramic base element in a monolithic ceramic capacitor as a monolithic ceramic electronic component according to a second preferred embodiment of the present invention.

A second preferred embodiment of the present invention is illustrated in FIG. 8. FIG. 8 is a sectional view corresponding to FIG. 3. Equivalent elements in FIG. 8 to those in FIG. 3 are denoted by the same reference symbols and duplicate descriptions of those elements are omitted here.

In a monolithic ceramic capacitor 1a according to the second preferred embodiment, an outer-layer dummy conductor 7a is arranged such that the outer-layer dummy conductor 7a does not penetrate through the ceramic base element 2 in the widthwise direction and it is separated in the widthwise direction.

Third Preferred Embodiment

Figure 9:
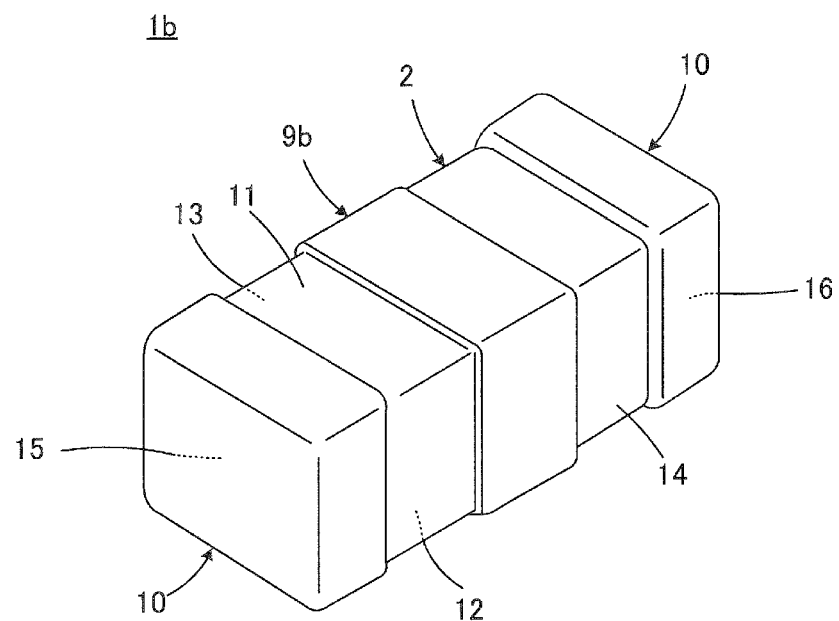
FIG. 9 is a perspective view illustrating an external appearance of a monolithic ceramic capacitor as a monolithic ceramic electronic component according to a third preferred embodiment of the present invention.
Figure 10:
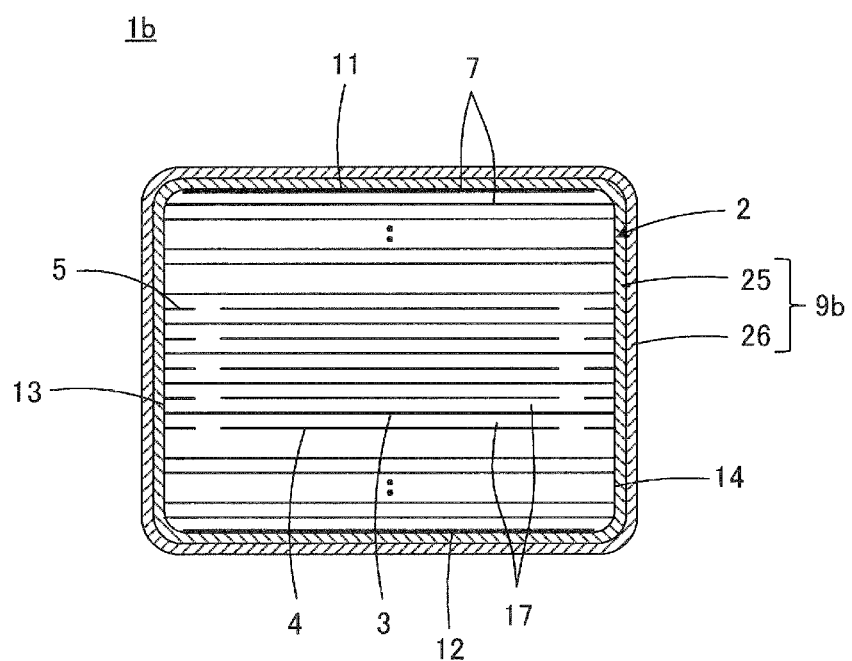
FIG. 10 is a sectional view taken along a plane parallel to end surfaces of a ceramic base element in the monolithic ceramic capacitor illustrated in FIG. 9.

A third preferred embodiment of the present invention is illustrated in FIGS. 9 and 10. FIG. 9 is a perspective view corresponding to FIG. 1, and FIG. 10 is a sectional view corresponding to FIG. 3. Equivalent elements in FIGS. 9 and 10 to those in FIGS. 1 and 3 are denoted by the same reference symbols and duplicate descriptions of those elements are omitted here.

A monolithic ceramic capacitor 1b according to the third preferred embodiment includes a first outer electrode 9b, including an underlying layer 25 and an overlying layer 26 thereof, arranged to extend over the first and second lateral surfaces 13 and 14 and the first and second principal surfaces 11 and 12 of the ceramic base element 2 in a fully surrounding state.

In this preferred embodiment, the outer-layer dummy conductors 7 are preferably exposed in at least respective portions of the principal surfaces 11 and 12 by chipping off the ceramic layers 17, which define the principal surfaces 11 and 12, in the above-described polishing step after the firing. This operation adds plating deposition points on the principal surfaces 11 and 12, and hence enables the plated film for the underlying layer 25 of the first outer electrode 9b to be more easily formed in the fully surrounding state.

The outer-layer dummy conductor 7 is not always required to be exposed in its entirety at each of the principal surfaces 11 and 12, and it may be exposed in a discontinuously distributed form (e.g., in a mottled pattern). However, the exposed portions of the outer-layer dummy conductor 7 in each of the principal surfaces 11 and 12 of the outer-layer dummy conductor 7 are preferably evenly distributed over a region spanning from the first lateral surface 13 to the second lateral surface 14. Further, those exposed portions of the outer-layer dummy conductor 7 are desirably exposed without a break over the region spanning from the first lateral surface 13 to the second lateral surface 14. Thus, even when a portion where the outer-layer dummy conductor 7 is continuously exposed from the first lateral surface 13 to the second lateral surface 14 is small, a current-carrying area is arranged to continuously extend over the principal surfaces 11 and 12 from the first lateral surface 13 to the second lateral surface 14. Hence the current-carrying efficiency is maximized.

According to the third preferred embodiment, the plated film is continuously arranged so as to fully extend around the ceramic base element 2 in a plating growth process that is developed in the plating step to define the underlying layer 25 of the first outer electrode 9b such that an electrode area serving as the plating deposition point is increased. Therefore, the current-carrying efficiency is increased from the time at which the plated film has been continuously formed, and a thickness of the plated film formable per unit time is increased. In other words, with this preferred embodiment, a time required to form a film for the underlying layer 25 of the first outer electrode 9b in a predetermined thickness is shortened, and a cost is reduced.

In the first preferred embodiment described above, distal end portions of the first outer electrode 9 are present on the principal surfaces 11 and 12 of the ceramic base element 2. When stress is applied to the distal end portions of the first outer electrode 9 upon flexing of the board on which the monolithic ceramic capacitor 1 is mounted, the underlying layer 25 may be peeled off starting from those distal end portions with a relatively high possibility. According to the third preferred embodiment, however, the first outer electrode 9b is arranged in an endless manner such that there are no distal end portions of the first outer electrode. For that reason, peeling-off of the underlying layer 25 is very difficult to occur.

Further, in the first preferred embodiment described above, a plating solution used in the step of forming the overlying layer 26 by plating may intrude through the distal end portions of the underlying layer 25 of the first outer electrode 9, which portions are present on the principal surfaces 11 and 12, thus causing a possibility that reliability may degrade. With the third preferred embodiment, however, the underlying layer 25 of the first outer electrode 9b has no distal end portions, and hence degradation of reliability is very difficult to occur.

Moreover, since the first outer electrode 9b is arranged of the plated film fully extending around the ceramic base element 2, the first outer electrode 9b can be arranged in a state smoothly covering the outer surfaces of the ceramic base element 2. Therefore, the monolithic ceramic capacitor 1b is less apt to roll unintentionally and it can maintain a stable posture when mounted.

Fourth Preferred Embodiment

Figure 11:
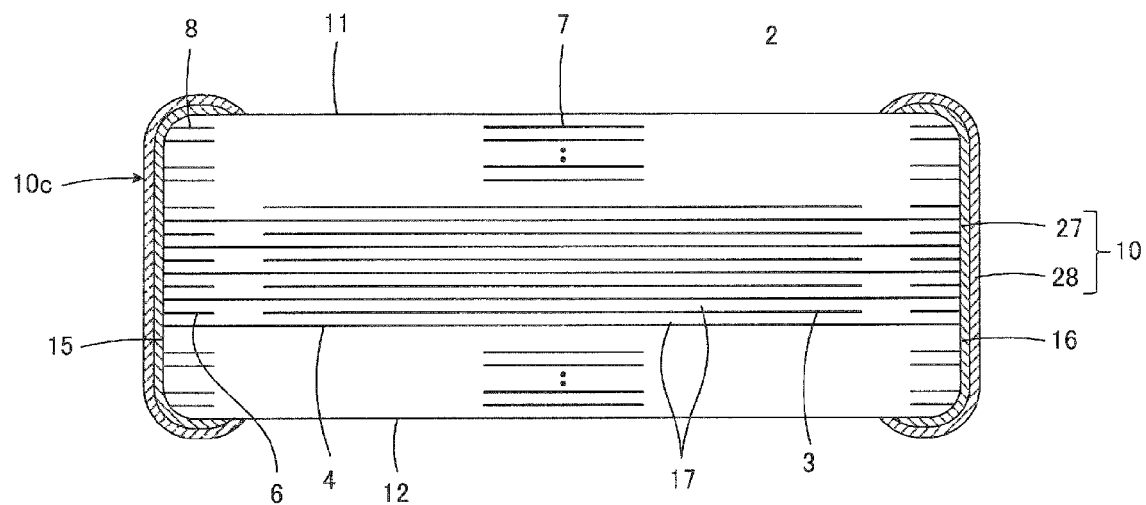
FIG. 11 is a sectional view taken along a plane parallel to lateral surfaces of a ceramic base element in a monolithic ceramic capacitor as a monolithic ceramic electronic component according to a fourth preferred embodiment of the present invention.
Figure 12:
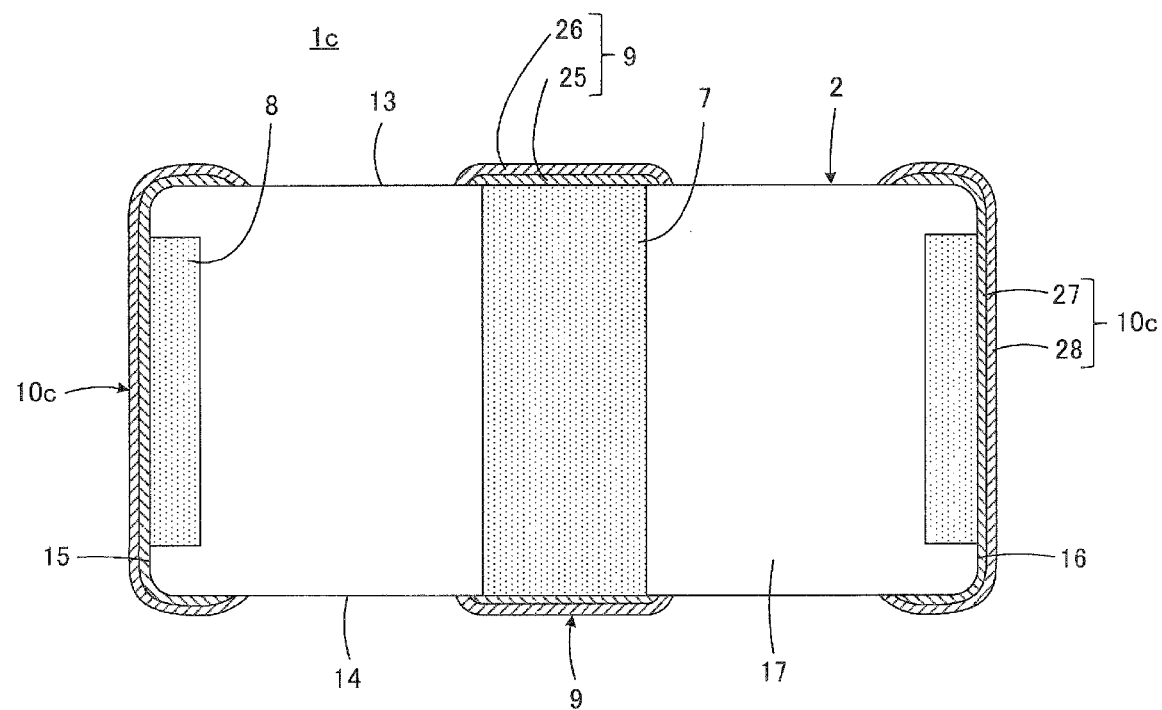
FIG. 12 is a sectional view taken along a plane parallel to principal surfaces of the ceramic base element in the monolithic ceramic capacitor illustrated in FIG. 11, the plane including outer-layer dummy conductors that extend therein.

A fourth preferred embodiment of the present invention is illustrated in FIGS. 11 and 12. FIG. 11 is a sectional view corresponding to FIG. 2, and FIG. 12 is a sectional view corresponding to FIG. 6. Equivalent elements in FIGS. 11 and 12 to those in FIGS. 2 and 6 are denoted by the same reference symbols and duplicate descriptions of those elements are omitted here.

A monolithic ceramic capacitor 1c according to the fourth preferred embodiment includes a second outer-layer dummy electrode 8 that is flush with the outer-layer dummy conductor 7.

Further, an underlying layer 27 of a second outer electrode 10c preferably is entirely constituted as a plated film. Therefore, the underlying layers 25 and 27 of the first and second outer electrodes 9 and 10c can be formed at the same time.

The second outer-layer dummy conductor 8 functions as a deposition point for the plated film that constitutes the underlying layer 27 of the second outer electrode 10c, thereby increasing the current-carrying efficiency.

Other Preferred Embodiments

The dummy conductor, particularly the outer-layer dummy conductor, may contribute to development of electric characteristics. Further, the dummy conductor may have any desired shape. For example, the outer-layer dummy conductor may have the same shape as the inner electrode.

EXPERIMENTAL EXAMPLES

In accordance with the third preferred embodiment, non-limiting samples of the monolithic ceramic capacitor were fabricated as follows.
(1) Size in the lengthwise direction×size in the widthwise direction of the ceramic base element: 1.6 mm×0.8 mm (however, the size in the heightwise direction differs depending on the samples)
(2) First Outer Electrode
Underlying layer: Cu plated film having a thickness of 10 μm
Overlying layer: Ni plated film having a thickness of 3 μm and Sn plated film having a thickness of 3 μm, the latter being coated on the former
(3) Second Outer Electrode
Underlying layer: Cu plated film having a thickness of 10 μm and Cu sintered metal film having a thickness of 15 μm, the latter being coated on the former
Overlying layer: Ni plated film having a thickness of 3 μm and Sn plated film having a thickness of 3 μm, the latter being coated on the former
(4) Inner Electrode
Distance between the inner electrodes: equal to the distance d described later
Thickness of the inner electrode: 0.56 μm
Number of the inner electrodes: 345
(5) Inner-Layer Dummy Conductor
Parameter values are the same as those for the inner electrode (6) Outer-Layer Dummy Conductor
Interval d between the adjacent outer-layer dummy conductors: as per listed in Table 1
Thickness of the outer-layer dummy conductor: 0.56 μm
Number n of the outer-layer dummy conductors in each outer-layer dummy group: as per listed in Table 1
Total number N of the outer-layer dummy conductors in each of the upper and lower outer layer portions: as per listed in Table 1
Interval g between the adjacent outer-layer dummy groups: as per listed in Table 1

As indicated in Table 1, BDV and a plating failure were evaluated for each of the samples with d, n, N and g each set to different values from one another.

The measurement of d and g was carried out by preparing three capacitors per sample type, and grinding the ceramic base element of each capacitor to about ½ in the widthwise direction such that a cross-section defined by a certain size in the lengthwise direction and a certain size in the thickness direction was exposed to the ground surface.

Further, the interval d was obtained by measuring, in the above-mentioned cross-section, respective intervals between adjacent twos of all the outer-layer dummy conductors, which were present in the outer layer portion on the side closer to the first principal surface and which were positioned at about ½ of the size in the lengthwise direction, with an electron microscope, and by calculating an average value of the intervals measured for the three samples.

The interval g was obtained by measuring, in the above-mentioned cross-section, respective intervals between adjacent twos of all the outer-layer dummy groups, which were present in the outer layer portion on the side closer to the first principal surface and which were positioned at about ½ of the size in the lengthwise direction, with the same electron microscope, and by calculating an average value of the intervals measured for the three samples.

BDV was measured by preparing 10 capacitors per sample type, and carrying out a measurement under condition of voltage boosting rate of 100 V/sec with a DC voltage breakdown testing device.

The plating failure was evaluated by preparing 1500 capacitors per sample type, the capacitors being each in a stage where the Cu plated film serving as the underlying layer of the first outer electrode was formed, confirming a state of the Cu plated film between the outer layer portion and the inner layer portion with an optical microscope, determining the capacitor, in which the plated film was disconnected, to be defective for the reason of a plating failure, and counting the number of samples, which exhibited the plating failure, among the 1500 capacitors.

The Cu plated film defining as the underlying layer of the first outer electrode was preferably formed as follows. First, strike Cu plating was carried out on condition of a current density of 0.1 A/dm$^2$ for 60 minutes with the rotating barrel plating by using a plating bath with pH of 8.5 and a bath temperature of 25° C., the plating bath containing 14 g/L of copper pyrophosphate, 120 g/L of potassium pyrophosphate, and 10 g/L of potassium oxalate. Then, thick Cu plating was carried out on condition of a current density of 0.3 A/dm$^2$ for 60 minutes with the rotating barrel plating by using a Pyro-bright processing bath, available from Uyemura & Co., Ltd., with pH of 8.8 and a bath temperature of 55° C. As a result, the Cu plated film was formed.

TABLE 1

| Sample No. | d (μm) | n (Number of Conductors) | N (Number of Conductors) | g (μm) | BDV (V) | Plating Failure |
|---|---|---|---|---|---|---|
| Sample 1 | 1.24 | 1 | 56 | 1.24 | 96.1 | 0/1500 |
| Sample 2 | 1.21 | 2 | 38 | 2.42 | 103.8 | 0/1500 |
| Sample 3 | 1.22 | 2 | 28 | 3.66 | 104.7 | 0/1500 |
| Sample 4 | 1.22 | 2 | 23 | 4.88 | 105.4 | 0/1500 |
| Sample 5 | 1.20 | 2 | 20 | 6.00 | 105.1 | 0/1500 |
| Sample 6 | 1.20 | 2 | 16 | 7.20 | 105.8 | 2/1500 |
| Sample 7 | 1.24 | 2 | 14 | 8.68 | 106.2 | 7/1500 |
| Sample 8 | 1.20 | 1 | 28 | 2.40 | 101.7 | 0/1500 |
| Sample 9 | 1.19 | 3 | 42 | 2.38 | 103.2 | 0/1500 |
| Sample 10 | 1.21 | 3 | 35 | 3.63 | 104.2 | 0/1500 |
| Sample 11 | 1.23 | 3 | 29 | 4.92 | 104.6 | 0/1500 |

As seen from Table 1, high BDV was achieved with Samples 2 to 7 and 9 to 11 in which g was greater than d and n was 2 or more.

In particular, good adhesion of the plated film was further obtained with Samples 2 to 5 and 9 to 11 each satisfying g≤about 6 μm.

Though not listed in Table 1, it is also confirmed that, as a result of conducting similar experiments in which, among the above-described conditions for EXPERIMENTAL EXAMPLES, the interval d between the adjacent outer-layer dummy conductors were changed to about 3.0 μm or about 0.7 μm, for example, similar advantageous effects to those in the above-described experimental results can be obtained.

The present invention is not limited to the above-described monolithic ceramic capacitor, and it can also be applied to another type of monolithic ceramic electronic component. For example, when the ceramic base element is made of a piezoelectric ceramic, a monolithic ceramic electronic component functioning as a piezoelectric component can be provided. When the ceramic base element is made of a semiconductor ceramic, e.g., a spinel ceramic, a monolithic ceramic electronic component functioning as a thermistor can be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A monolithic ceramic electronic component comprising:
   a ceramic base element including a plurality of stacked ceramic layers and outer surfaces defined by first and second principal surfaces opposed to each other, first and second lateral surfaces opposed to each other, and first and second end surfaces opposed to each other;
   first inner electrodes disposed inside the ceramic base element and each including a first opposing portion and a first lead-out portion led out from the first opposing portion to the outer surface of the ceramic base element;
   second inner electrodes disposed inside the ceramic base element and each including a second opposing portion, which is opposed to the first opposing portion with the ceramic layer interposed therebetween, and a second lead-out portion led out from the second opposing portion to the outer surface of the ceramic base element;
   a first outer electrode disposed on the outer surface of the ceramic base element and including a plated film that directly covers an exposed portion of the first lead-out portion; and
   a second outer electrode disposed on the outer surface of the ceramic base element, electrically connected to the exposed portion of the second lead-out portion, and connected to a different potential from that of the first outer electrode; wherein
   an extending direction of an interconnection between the first and second principal surfaces is defined as a height direction;
   a region where the first inner electrodes and the second inner electrodes are present in the height direction is defined as an inner layer portion; and
   a region where the first inner electrodes and the second inner electrodes are both not present in the height direction is defined as an outer layer portion;
   the outer layer portion includes:
      a first outer layer portion disposed at an upper side of the inner layer portion in the height direction and extending to the first principal surface; and
      a second outer layer portion disposed at a lower side of the inner layer portion in the height direction and extending to the second principal surface;
   outer-layer dummy conductors are arranged in the outer layer portion such that the outer-layer dummy conductors are each led out to the outer surface of the ceramic base element in overlapped relation to the first lead-out portion when the ceramic base element is viewed through projection in the height direction, the outer-layer dummy conductors including exposed portions directly covered with the plated film of the first outer electrode;
   two or more outer-layer dummy conductors are successively arranged at predetermined intervals in the height direction to define a plurality of outer-layer dummy groups in at least one of the first outer layer portion and the second outer layer portion; and
   an interval between adjacent outer-layer dummy conductors within each of the plurality of outer-layer dummy groups is d and an interval between adjacent outer-layer dummy groups of the plurality of outer-layer dummy groups in the at least one of the first outer layer portion and the second outer layer portion is g, and g is greater than d.

2. The monolithic ceramic electronic component according to claim 1, wherein g≤about 6 μm.

3. The monolithic ceramic electronic component according to claim 1, wherein, an extending direction of an interconnection between the first and second lateral surfaces is defined as a widthwise direction; and
   an extending direction of an interconnection between the first and second end surfaces is defined as a lengthwise direction;
   a size of each of the first and second lateral surfaces along the lengthwise direction is longer than a size of each of the first and second end surfaces along the widthwise direction;
   the first opposing portion is substantially rectangular and includes a longer side and a shorter side; and
   the first lead-out portion is led out from the longer side of the first opposing portion to at least one of the first and second lateral surfaces.

4. The monolithic ceramic electronic component according to claim 3, wherein the first lead-out portion is led out to be positioned across a center of at least one of the first and second lateral surfaces in the lengthwise direction.

* * * * *